United States Patent [19]

Hirano

[11] Patent Number: 5,652,450

[45] Date of Patent: Jul. 29, 1997

[54] NONVOLATILE SEMICONDUCTOR STORAGE DEVICE

[75] Inventor: Yasuaki Hirano, Yamatokoriyama, Japan

[73] Assignee: Sharp Kabushiki Kaisha, Osaka, Japan

[21] Appl. No.: 684,585

[22] Filed: Jul. 19, 1996

[30] Foreign Application Priority Data

Aug. 11, 1995 [JP] Japan .................................. 7-206365

[51] Int. Cl.$^6$ .......................... H01L 29/788; G11C 11/34
[52] U.S. Cl. .......................... 257/323; 257/315; 257/321; 365/184; 365/185.11; 365/185.12; 365/185.23
[58] Field of Search .................................. 257/315, 321, 257/323; 365/184, 185.11, 185.12, 185.23

[56] References Cited

FOREIGN PATENT DOCUMENTS 3-219496  9/1991  Japan .
5-28784   2/1993  Japan .

OTHER PUBLICATIONS

Tanaka et al., "Flash memory with negative voltage scheme" *Technical Report of Institute of Electronics, Information and Communication Engineers in Japan*, ICD91–135 (1991) pp. 9–14.

*Primary Examiner*—Mahshid D. Saadat
*Assistant Examiner*—Valencia Martin Wallace
*Attorney, Agent, or Firm*—Morrison & Foerster LLP

[57] ABSTRACT

According to the present invention, a nonvolatile semiconductor storage device for applying to each word line either one of a selected voltage and a non-selected voltage, corresponding to a selection state and a non-selection state, respectively, is provided. The selection state or the non-selection state is selected in accordance with an address signal in each operational mode. The nonvolatile semiconductor storage device includes: a plurality of applied voltage decoders operating in accordance with an applied voltage selection state or an applied voltage non-selection state, a plurality of control voltage decoders, each of the control voltage decoders outputting a control voltage corresponding to either a control voltage selection state or a control voltage non-selection state and a plurality of driver circuits, each of the driver circuits being provided so as to correspond to each word line; receiving a first applied voltage, a second applied voltage and a control voltage which are output from a distinct combination of an applied voltage decoder and a control voltage decoder.

4 Claims, 16 Drawing Sheets

Memory cells

Channel width of p-channel MOSFET34 (μm)

NONVOLATILE SEMICONDUCTOR STORAGE DEVICE

BACKGROUND OF THE INVENTION

1. Field of the Invention

The present invention relates to a nonvolatile semiconductor storage device in which data is electrically rewritable.

2. Description of the Related Art

An ETOX (trademark of Intel, Inc. in U.S.A.) type memory cell is well-known as a memory cell for a flash electrically erasable programmable read-only memory (EEPROM). A flash EEPROM using this ETOX type memory cell generally performs a writing operation on a bit basis. On the other hand, a flash memory EEPROM performs two kinds of erasure operations: that is to say, an erasure operation of a "chip simultaneous erasure type" in which a high voltage is simultaneously applied to the sources of all of the cell transistors on a chip and an erasure operation of a "block erasure type" in which a high voltage is selectively applied only to the sources of the cell transistors included in a selected block.

The structure of a cell transistor for the above-described ETOX type memory cell is shown in FIG. 20. In this cell transistor, a source 22 and a drain 23 are formed by providing two semiconductor regions having the polarities opposite to each other in the surface-layer portions of a semiconductor substrate 21. Between the source 22 and the drain 23, a floating gate 25 is formed over the semiconductor substrate 21 via a gate insulating film 24 and a control gate 27 is formed over the floating gate 25 via an interlevel insulating film 26.

When data is written into the cell transistor (or in the case of programming), a low voltage Vss (e.g., 0 V) is applied to the source 22, a voltage Vps (e.g., 6 V) is applied to the drain 23 and a high voltage Vpp (e.g., 12 V) is applied to the control gate 27. Then, hot electrons and hot holes are generated between the source 22 and the drain 23 of this cell transistor. Though the hot holes flow into the semiconductor substrate 21, the hot electrons are injected into the floating gate 25. Therefore, the threshold voltage of the cell transistor is increased, so that the data can be stored therein in a nonvolatile manner.

On the other hand, when the data is read out therefrom, a low voltage Vss (e.g., 0 V) is applied to the source 22, a voltage Vinl (e.g., 1 V) slightly higher than the voltage Vss is applied to the drain 23 and a voltage Vcc (e.g., 5 V) is applied to the control gate 27. Then, the amount of the current flowing between the source 22 and the drain 23 is varied in accordance with the threshold voltage of this cell transistor. Therefore, if the amount of this current is sensed and whereby the data is assumed to be detected as "1" when the amount is larger than a predetermined current value or as "0" when the amount is smaller than the predetermined current value, the data stored in the cell transistor can be read out.

Furthermore, when the data is erased therefrom, a high voltage Vpp is applied to the source 22, the drain 23 is opened (or turned into a floating state) and a low voltage Vss is applied to the control gate 27. Then, a Fowler-Nordheim (FN) tunneling current flows between the floating gate 25 and the source 22 through the gate insulating film 24, and thereby the electrons which have been accumulated in the floating gate 25 are emitted, so that the data is erased.

Since the flash EEPROM applies a high voltage Vpp to the source 22 of the cell transistor for erasing data, the flash EEPROM has the following disadvantages.

(a) Since it becomes necessary to improve the pressure tightness on the side of the source 22 to which a high voltage Vpp is applied, various measures are taken for such a purpose: e.g., the diffusion depth of a semiconductor region for the source 22 is made deeper than that of the drain 23 and the concentration of the impurities contained therein is reduced. As a result, it becomes difficult to reduce the size of such a device.

(b) When a high voltage Vpp is applied to the source 22, hot holes are generated in the vicinity of this source 22 and a part of these hot holes are trapped in the gate insulating film 24. As a result, a window narrow effect is generated in the threshold voltage, so that the reliability of the cell transistor is degraded.

(c) In the flash EEPROM, a simple source 22 is commonly used within a block. Therefore, if the erasure operation is performed by applying a high voltage Vpp to this source 22, a unit used for erasing the data becomes at least as large as the block and the erasure operation cannot be performed based on a unit smaller than this block.

In order to eliminate the above-described disadvantages, a "negative voltage erasure method" in which a negative voltage is applied to the control gate 27 for erasing the data is used, for example. In this negative voltage erasure method, a voltage Vps (e.g., 6 V) is applied to the source 22, the drain 23 is opened and a negative voltage Vbb (e.g., −10 V) is applied to the control gate 27. In such a case, an FN tunneling current also flows between the floating gate 25 and the source 22 through the gate insulating film 24 and the electrons which have been accumulated in the floating gate 25 are emitted, whereby the data is erased. In addition, since a high voltage is not applied to the source 22 in this negative voltage erasure method, it is no longer necessary to particularly improve the pressure tightness on the side of the source 22. Accordingly, this method can contribute to reducing the size of the device. Moreover, since the voltage Vps applied to the source 22 is a relatively low voltage of about 6 V, for example, almost no hot holes are generated, thereby preventing the reliability of the cell transistor from being degraded. Furthermore, since the erasure operation is performed on both the control gate 27 and the source 22, it is possible to perform a sector erasure operation based on a unit smaller than a block using a common source, e.g., on a word line basis.

In this negative voltage erasure method, a negative voltage is applied to a word line connected to the gate of the cell transistor. Therefore, if the drain of an n-channel MOSFET of a CMOS inverter circuit used for a general driver circuit is connected to the word line, a leakage current flows from the side of a p-type semiconductor substrate, on which this n-channel MOSFET is formed, to the drain. Thus, a circuit configuration, as shown in FIG. 21, in which a negative voltage decoder 33 using a driver circuit formed of a p-channel MOSFET alone for applying a negative voltage to this word line 31 is provided independent of a positive voltage decoder 32 using a CMOS inverter circuit including an n-channel MOSFET as a driver circuit for applying a positive voltage to the word line 31, and in addition, a p-channel MOSFET 34 for blocking the negative voltage Vbb is further provided between the word line 31 and the positive voltage decoder 32, has conventionally been proposed (see, for example, "Flash Memory using Word Negative Voltage Erasure Method", Technical Report of Institute of Electronics, Information and Communication Engineers ICD 9-135, pp. 9–14, 1991 and Japanese Laid-Open Patent Publication No. 3-219496 entitled "Nonvolatile Semiconductor Storage Device"). However, if such a p-channel MOSFET 34 for blocking the negative voltage Vbb is provided for the flash EEPROM, the following disadvantages are caused.

(a) In the case where the negative voltage Vbb is applied to the word line 31, it may be impossible to definitely turn OFF the p-channel MOSFET 34 by applying a low voltage Vss (e.g., 0 V) to the gate thereof. Therefore, since it is necessary to apply a voltage Vcc (e.g., 5 V) to the gate of the p-channel MOSFET 34, the stress applied to the gate insulating film becomes too large.

(b) Since the p-channel MOSFET 34 has a small transconductance gm representing various driving abilities such as a switching speed in a MOSFET, the operation speed thereof becomes lower. On the other hand, if the transconductance gm is to be increased, then it is necessary to enlarge the channel width of the p-channel MOSFET 34. However, if the channel width is enlarged, then the layout area occupied by the p-channel MOSFET 34 is adversely increased. That is to say, the delay time of the p-channel MOSFET 34 greatly depends upon the channel width of the p-channel MOSFET 34 as shown in FIG. 22. Therefore, if the channel width is enlarged, the delay time of the p-channel MOSFET 34 is shortened and a high-speed operation is realized. Nevertheless, the layout area occupied by this p-channel MOSFET 34 provided for each word line 31 is also increased.

In order to eliminate the above-described disadvantages, an invention has been proposed in which it is no longer necessary to provide the p-channel MOSFET 34 shown in FIG. 21 by instead outputting both a positive voltage and a negative voltage to the word line by the use of a driver circuit 1 formed of a CMOS inverter circuit as shown in FIG. 23 (see, for example, Japanese Laid-Open Patent Publication No. 5-28784). This driver circuit 1 is formed of a CMOS inverter circuit including a p-channel MOSFET 1a and an n-channel MOSFET 1b. The source of the p-channel MOSFET 1a is connected to an n-type semiconductor well forming this MOSFET. On the other hand, the source of the n-channel MOSFET 1b is connected to a p-type semiconductor well forming this MOSFET. The word line is connected to the output of this CMOS inverter circuit, i.e., the drain of the p-channel MOSFET 1a and the n-channel MOSFET 1b. In addition, a positive voltage ranging from a low voltage Vss to a high voltage Vpp is supplied from a positive voltage supply circuit 6 to the source of the p-channel MOSFET 1a in accordance with the operational mode. On the other hand, a low voltage Vss or a negative voltage Vbb is supplied from a negative voltage supply circuit 4 to the source of the n-channel MOSFET 1b in accordance with the operational mode. The input of this CMOS inverter circuit is connected to the output of a NAND circuit 7a of an address decoder 7 for decoding an externally input address signal.

In the case where a negative voltage Vbb is supplied from the negative voltage supply circuit 4 to the driver circuit 1 having such a configuration, this negative voltage Vbb is applied not only to the source of the n-channel MOSFET 1b but also to the p-type semiconductor well. As a result, a forward bias is caused between the p-type semiconductor well and the source, thereby preventing the leakage current from flowing. Consequently, not only the above-described disadvantage can be eliminated since the p-channel MOSFET 34 shown in FIG. 21 for blocking the negative voltage Vbb is no longer necessary to be provided, but also the positive voltage decoder 32 and the negative voltage decoder 33 can be integrally formed, so that the circuit size can also be reduced. Nevertheless, in order to apply the negative voltage Vbb to the p-type semiconductor well forming the n-channel MOSFET 1b thereon in such a manner, it is necessary to electrically isolate the p-type semiconductor well from the p-type semiconductor substrate by providing an n-type semiconductor well therebetween.

However, since a conventional circuit shown in FIG. 23 corresponds to a case where data is erased mainly on a chip basis or on a block basis, it is adversely difficult for such a circuit to correspond to a sector erasure method or the like in which only the data stored in a memory cell connected to an erasure unit smaller than a chip or a block (e.g., a word line) is erased by making full use of the advantages of the negative voltage erasure method.

FIG. 24 shows a circuit enabling a sector erasure operation for performing an erasure operation on a word line basis that utilizes the circuit configuration shown in FIG. 23. In this circuit, not only the NAND circuit 7a but also another NAND circuit 7b for decoding an address signal in a similar manner and a negative voltage switching circuit 7c for switching the negative voltage Vbb in accordance with the output of the NAND circuit 7b are provided for the address decoder 7. The negative voltage Vbb output from the negative voltage supply circuit 4 is to be supplied to the source of the n-channel MOSFET 1b of the driver circuit 1 via the negative voltage switching circuit 7c. In the case where an erasure signal W/E-bar is at an L level (in the erasure mode), when the output level of the NAND circuit 7b becomes L (selection), the negative voltage switching circuit 7c outputs the negative voltage Vbb supplied from the negative voltage supply circuit 4 and when the output level of the NAND circuit 7b becomes H (non-selection), the negative voltage switching circuit 7c outputs a low voltage Vss or a voltage Vinh slightly higher than Vss. On the other hand, in the case where the erasure signal W/E-bar is at an H level (in the writing mode and the reading mode), the negative voltage switching circuit 7c outputs a low voltage Vss. Consequently, in the erasure mode, the negative voltage Vbb is supplied only to the driver circuit 1 selected based on the address signal and can be output through the n-channel MOSFET 1b of this driver circuit 1 to the word line. As a result, an erasure operation can be performed on a word line basis.

However, one driver circuit 1 and one address decoder 7 are required to be provided for every word line in the circuit shown in FIG. 24. Therefore, assuming that there are 512 word lines, it is necessary to provide 512 driver circuits 1 and 512 address decoders 7, so that the layout area occupied by these circuits adversely becomes too large.

Furthermore, since the negative voltage Vbb is applied only to the p-type semiconductor well of the n-channel MOSFET 1b of the selected driver circuit 1 in the circuit shown in FIG. 24, the n-channel MOSFETs 1b of the respective driver circuits 1 are required to be formed over the p-type semiconductor wells which are electrically isolated from each other. Therefore, the layout area occupied by the driver circuits 1 also becomes too large.

SUMMARY OF THE INVENTION

The present invention provides a nonvolatile semiconductor storage device that overcomes the short-comings of the prior art.

In accordance with a preferred embodiment of the present invention, a nonvolatile semiconductor storage device for applying to each of a plurality of word lines either one of a selected voltage and a non-selected voltage, corresponding to a selection state and a non-selection state, respectively, the selection state or the non-selection state being selected in accordance with an address signal in each operational mode, comprises: a plurality of applied voltage decoders operating in accordance with an applied voltage selection state or an applied voltage non-selection state which is selected in accordance with the address signal in each operational mode, each of the applied voltage decoders outputting a first applied voltage to be a selected voltage and a second applied voltage to be a non-selected voltage in the applied voltage selection state and outputting a first applied voltage and a second applied voltage both of which are to be non-selected voltages in the applied voltage non-selection state; a plurality of control voltage decoders, each of the control voltage decoders outputting a control voltage corresponding to either a control voltage selection state or a control voltage non-selection state which is selected in accordance with the address signal in each operational mode; and, a plurality of driver circuits. Each of the driver circuits is provided so as to correspond to one of the plurality word lines; each of the driver circuits receives a first applied voltage, a second applied voltage and a control voltage which are output from a corresponding distinct combination of an applied voltage decoder and a control voltage decoder; each of the driver circuits outputs the first applied voltage to the word line corresponding to the decoder circuit when the control voltage in the control voltage selection state is input to the decoder circuit; and, each of the driver circuits outputs the second applied voltage to the word line corresponding to the decoder circuit when the control voltage in the control voltage non-selection state is input to the decoder circuit.

In accordance with one aspect of a preferred embodiment of the present invention, the nonvolatile semiconductor storage device is further characterized by the selected voltage applied to a word line in the selection state being a negative voltage in an erasure mode.

In accordance with another aspect of a preferred embodiment of the present invention, the nonvolatile semiconductor storage device is further characterized by each of the plurality of driver circuits being formed of a CMOS inverter circuit in which a first applied voltage and a second applied voltage output from the applied voltage decoder corresponding to the driver circuit are used as power supplies; a control voltage output from the control voltage decoder corresponding to the driver circuit is used as an input; and, an output of the inverter circuit is connected to a word line corresponding to the driver circuit.

In accordance with another aspect of a preferred embodiment of the present invention, the nonvolatile semiconductor storage device is further characterized by an n-channel MOSFET of the CMOS inverter circuit being formed on a p-type semiconductor well which is formed in a p-type semiconductor substrate via an n-type semiconductor well or an insulator layer; a p-channel MOSFET of the CMOS inverter circuit being formed on an n-type semiconductor well which is formed in the p-type semiconductor well; and, a substrate voltage control circuit for applying a negative voltage having an absolute value equal to or larger than that of the negative selected voltage to the p-type semiconductor well in the erasure mode being provided.

By utilizing the present invention, in the case where a control voltage in a control voltage selection state is input to each driver circuit, if a first applied voltage and a second applied voltage are in an applied voltage selection state, the driver circuit outputs the first applied voltage which is the selected voltage to the corresponding word line. However, in such a case, if the first applied voltage and the second applied voltage are in an applied voltage non-selection state, the driver circuit outputs the first applied voltage which is the non-selected voltage to the corresponding word line. On the other hand, in the case where a control voltage in a control voltage non-selection state is input to the driver circuit, the driver circuit outputs the second applied voltage which is the non-selected voltage to the corresponding word line irrespective of the states of the first and the second applied voltages. Therefore, only in the case where both the applied voltage decoder and the control voltage decoder, which correspond to the driver circuit, are in a selection state will the driver circuit output a selected voltage to the corresponding word line. In the other cases, the driver circuit outputs a non-selected voltage to the corresponding word line. Therefore, the voltages applied to the respective word lines can be controlled depending upon the states of the applied voltage decoders and the control voltage decoders.

Herein, assuming that the number of word lines is N, the required number of driver circuits also becomes N. In addition, a conventional circuit further requires one applied voltage switching circuit for selectively outputting a selected voltage or a non-selected voltage in accordance with each operational mode and a number N of address decoders which decode the address signal, thereby making each of the driver circuits output either the selected voltage or the non-selected voltage. However, according to the present invention, it is necessary to provide a number I of applied voltage decoders and a number J of control voltage decoders such that a relationship $N=I \times J$ is satisfied. The total number of these circuits becomes equal to I+J. Only when one of I and J is 1 and the other is N, I+J=N+1. However, assuming that both of I and J are 2 or more, the larger this number becomes, the larger the difference obtained by subtracting I+J from N becomes (I+J becomes minimum when I=J). Therefore, since the total number of these circuits is expressed by the relationship I+J≦N, the present invention makes it possible to reduce the layout area occupied by the peripheral circuits for driving the word lines.

In addition, by utilizing the above-described configuration, the present invention is applicable to a nonvolatile semiconductor storage device operable in a negative voltage erasure method in which a negative voltage is applied to the word line in a selection state in the erasure mode.

Moreover, by making a driver circuit using a CMOS inverter circuit apply a negative voltage for the erasure mode and a positive voltage for the other operational modes to a common word line under the above-described configuration, it is no longer necessary to separately provide an address decoder in the erasure mode.

Furthermore, by forming an n-channel MOSFET for a CMOS inverter circuit on a p-type semiconductor well which is formed over a p-type semiconductor substrate via an n-type semiconductor well or an insulator layer so as to electrically isolate the n-channel MOSFET from the p-type semiconductor substrate under the above-described configuration, a substrate voltage control circuit can apply a voltage equal to or higher than a negative voltage, which is the selected voltage, to the p-type semiconductor well in the erasure mode, it is possible to prevent a leakage current from flowing from the p-type semiconductor well to the source of the n-channel MOSFET in the case of applying a negative voltage to the source of the n-channel MOSFET.

Furthermore, since a voltage equal to or higher than a negative voltage is commonly applied to the p-type semiconductor wells for all the driver circuits, an erasure operation can be performed on a word line basis without isolating the p-type semiconductor wells, on which CMOS inverter circuits for the respective driver circuits are formed, from each other.

Thus, the invention described herein makes possible the advantage of providing a nonvolatile semiconductor storage device which can reduce the size of peripheral circuits by selecting a driver circuit in accordance with a particular combination of an applied voltage decoder and a control voltage decoder.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described with reference to the accompanying drawings.

A flash EEPROM operates in the respective modes by applying voltages shown in the following Table 1 to the word lines, each of which is connected to the source, the drain and the gate of a cell transistor for a memory cell.

TABLE 1

| mode | selected word line | non-selected word line | source | drain |
|---|---|---|---|---|
| writing | Vpp (12 V) | Vss (0 V) | Vss (0 V) | Vps (6 V) |
| reading | Vcc (5 V) | Vss (0 V) | Vss (0 V) | Vinl (1 V) |
| erasure | Vbb (−10 V) | Vinh (3 V) | Vps (6 V) | open |

More specifically, in the writing mode, a voltage Vss (e.g., 0 V) is applied to the source; a voltage Vps (e.g., 6 V) is applied to the drain; a selected voltage Vpp (e.g., 12 V) is applied to the selected word line which has been selected based on an address signal; and a non-selected voltage Vss (e.g., 0 V) is applied to the non-selected word lines which have not been selected based on this address signal. On the other hand, in the reading mode, the voltage Vss is applied to the source; a voltage Vinl (e.g., 1 V) is applied to the drain; a selected voltage Vcc (e.g., 5 V) is applied to the selected word line; and the non-selected voltage Vss is applied to the non-selected word lines. Furthermore, in the erasure mode, the voltage Vps is applied to the source; the drain is opened; a negative selected voltage Vbb (e.g., −10 V) is applied to the selected word lines; and a non-selected voltage Vinh (e.g., 3 V) applied to the non-selected word lines. It is noted that the non-selected voltage applied to the non-selected word lines in the erasure mode is sometimes a low voltage vss. However, for purposes of this example, a positive voltage Vinh is applied thereto for preventing the erasure in the non-selected memory cells.

Figure 2:
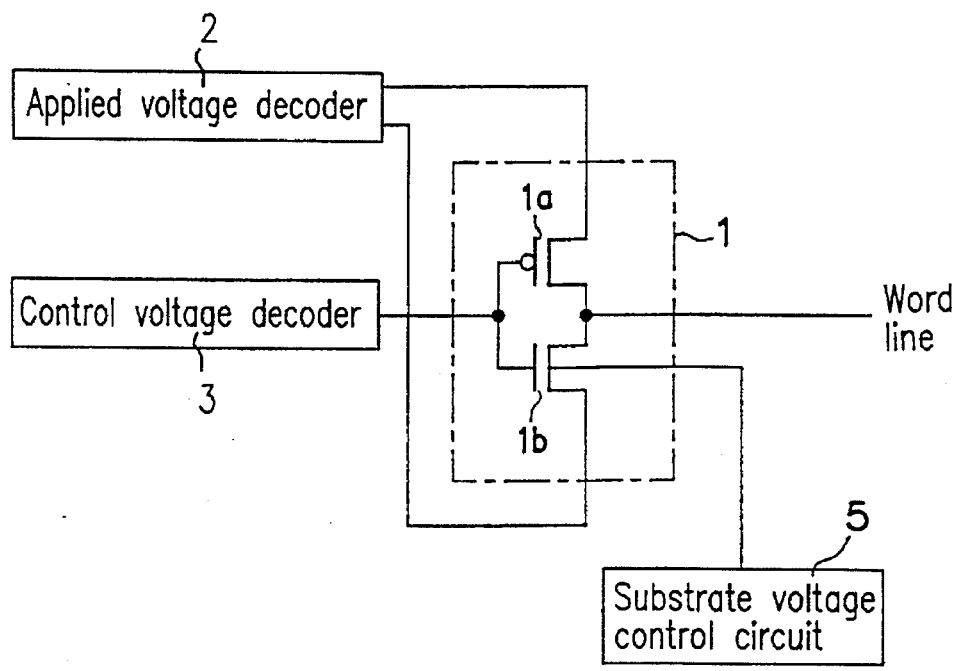
FIG. 2 is a circuit block diagram illustrating an example of the present invention and showing peripheral circuits for driving one word line.

A fundamental circuit for applying the selected voltage and the non-selected voltage to one word line is shown in FIG. 2. A driver circuit 1 is formed of a CMOS inverter circuit including a p-channel MOSFET 1a and an n-channel MOSFET 1b and one word line is connected to the output of this CMOS inverter circuit or the drain of the MOSFETs 1a and 1b. Moreover, a first applied voltage and a second applied voltage are respectively supplied as power supplies from an applied voltage decoder 2 to the sources of these MOSFETs 1a and 1b. The applied voltage decoder 2 is a decoder which decodes an address signal thereby turning into either an applied voltage selection state in the case where the address value is within an address range specific to the applied voltage decoder 2 or an applied voltage non-selection state in the case where the address value is out of the address range. The applied voltage decoder 2 outputs an applied voltage corresponding to the state. The first applied voltage is a voltage to be a selected voltage (Vpp/Vcc/Vbb) in the case where the applied voltage decoder 2 is in an applied voltage selection state or a non-selected voltage (Vss/Vss/Vinh) in the case where the applied voltage decoder 2 is in an applied voltage non-selection state. In the writing mode and the reading mode, the first applied voltage is supplied to the source of the p-channel MOSFET 1a, while in the erasure mode, the first applied voltage is supplied to the source of the n-channel MOSFET 1b. The second applied voltage is a voltage which always becomes a non-selected voltage (Vss/Vss/Vinh) irrespective of the states of the applied voltage decoder 2. In the writing mode and the reading mode, the second applied voltage is supplied to the source of the n-channel MOSFET 1b, while in the erasure mode, the second applied voltage is supplied to the source of the p-channel MOSFET 1a. Therefore, the applied voltage decoder 2 supplies the voltages shown in the following Table 2 to the source of the p-channel MOSFET 1a in accordance with the respective operational modes and the states variable depending upon the address signal.

TABLE 2

| state of applied voltage decoder | writing | reading | erasure |
| --- | --- | --- | --- |
| applied voltage selection state | Vpp (12 V) | Vpp (5 V) | Vinh (3 V) |
| applied voltage non-selection state | Vss (0 V) | Vss (0 V) | Vinh (3 V) |

On the other hand, the applied voltage decoder 2 supplies the voltages shown in the following Table 3 to the source of the n-channel MOSFET 1b.

TABLE 3

| state of applied voltage decoder | writing | reading | erasure |
| --- | --- | --- | --- |
| applied voltage selection state | Vss (0 V) | Vss (0 V) | Vbb (−10 V) |
| applied voltage non-selection state | Vss (0 V) | Vss (0 V) | Vinh (3 V) |

A control voltage is applied from the control voltage decoder 3 to the input of the CMOS inverter circuit of the driver circuit 1 or the gate of the MOSFETs 1a and 1b. The control voltage decoder 3 is a decoder which decodes an address signal thereby turning into either a control voltage selection state in the case where the address value is within an address range specific to the control voltage decoder 3 or a control voltage non-selection state in the case where the address value is out of the address range and outputs a control voltage corresponding to each of these states. In the case where the control voltage decoder 3 is in the control voltage selection state, the control voltage becomes a voltage making the CMOS inverter circuit of the driver circuit 1 output the first applied voltage to the word line. On the other hand, in the case where the control voltage decoder 3 is in the control voltage non-selection state, the control voltage becomes a voltage making the CMOS inverter circuit output the second applied voltage to the word line. That is to say, in the control voltage selection state, the control voltage becomes a voltage for turning ON only the p-channel MOSFET 1a in the writing mode and the reading mode and only the n-channel MOSFET 1b in the erasure mode. On the other hand, in the control voltage non-selection state, the control voltage becomes a voltage for turning ON only the n-channel MOSFET 1b in the writing mode and the reading mode and only the p-channel MOSFET 1a in the erasure mode. Therefore, if both of the applied voltage decoder 2 and the control voltage decoder 3 are in the selection state, then the selected voltages Vpp, Vcc and Vbb are output to the word line in the writing mode, the reading mode and the erasure mode, respectively. On the other hand, if at least one of the applied voltage decoder 2 and the control voltage decoder 3 is in the non-selection state, then the non-selected voltages Vss, Vss and Vinh are output to the word line in the writing mode, the reading mode and the erasure mode, respectively. Consequently, voltages can be applied in accordance with the selection states of the word line in the respective operational modes as shown in Table 1.

Figure 1:
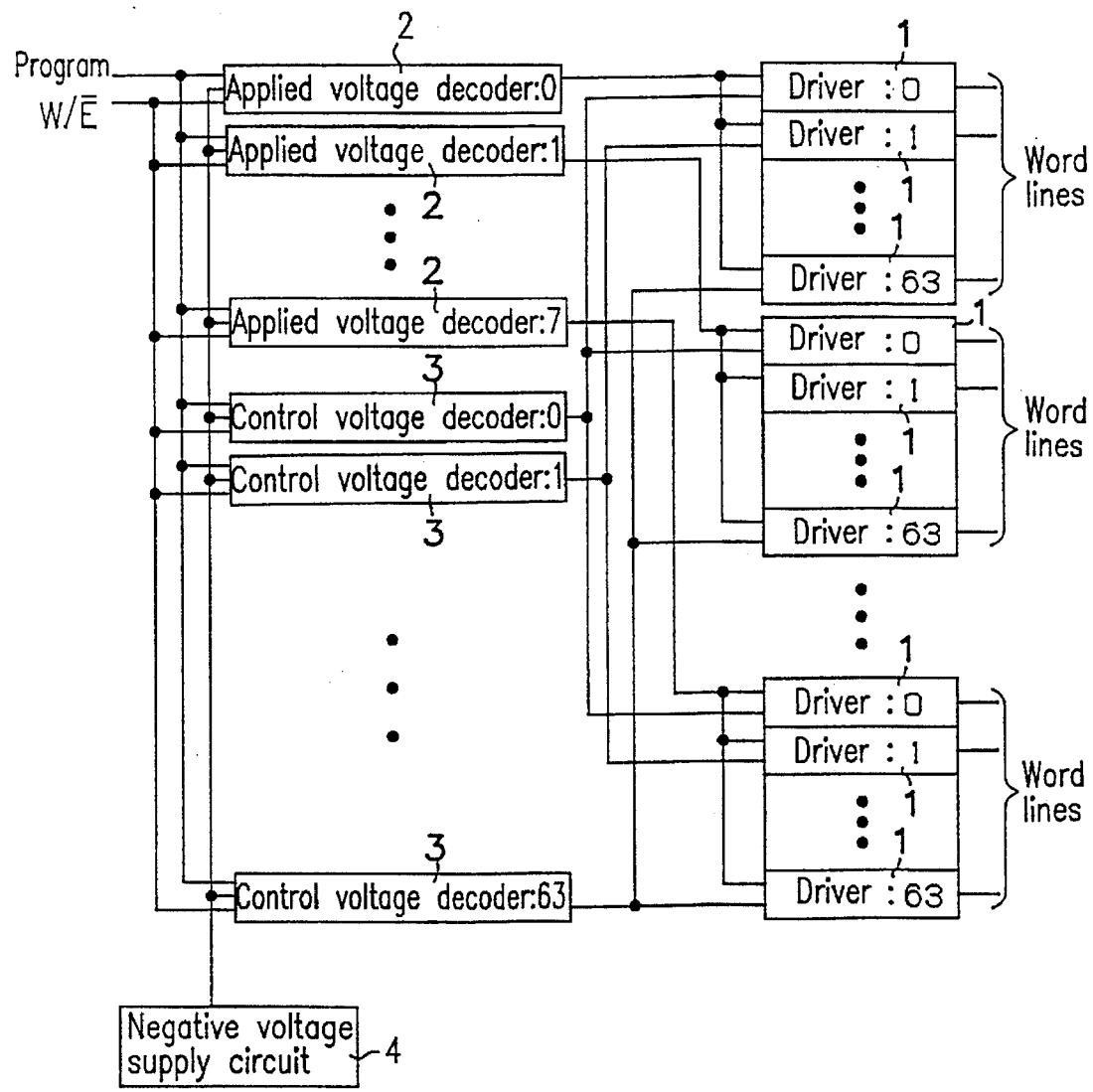
FIG. 1 is a block diagram illustrating an example of the present invention and showing peripheral circuits for driving word lines.

An exemplary connection among the driver circuits 1, the applied voltage decoders 2 and the control voltage decoders 3 in a flash EEPROM provided with 512 word lines is shown in FIG. 1. Each of the 512 word lines is connected to the output of each of the 512 driver circuits 1 corresponding thereto. In addition, the 512 driver circuits 1 are divided into 8 sets, each of which consists of 64 driver circuits numbered "0" "63", respectively. Eight applied voltage decoders 2 numbered "0" to "7" are provided. For example, the first applied voltage decoder 2 numbered "0" supplies a common applied voltage to all of the 64 driver circuits 1 included in the first set, the second applied voltage decoder 2 numbered "1" supplies a common applied voltage to all of the 64 driver circuits 1 included in the second set, and so on. In this way, each applied voltage decoder 2 is to supply a common applied voltage to all of the 64 driver circuits 1 included in a set corresponding to the applied voltage decoder 2. Sixty-four control voltage decoders 3 numbered "0" to "63" are provided. For example, the first control voltage decoder 3 numbered "0" supplies a common control voltage to the first driver circuit 1 in each set, the second control voltage decoder 3 numbered "1" supplies a common control voltage to the second driver circuit 1 in each set, and so on. In this way, each control voltage decoder 3 is to apply a common control voltage to the 8 driver circuits 1, each of which is selected from each of the 8 sets of driver circuits 1 so as to correspond to the control voltage decoder 3. Therefore, a different combination of an applied voltage decoder 2 for supplying an applied voltage and a control voltage decoder 3 for applying a control voltage corresponds to each of the 512 driver circuits 1. Accordingly, when one applied voltage decoder 2 and one control voltage decoder 3 are turned into a selection state in accordance with an address signal, only one of the 512 driver circuits 1 outputs a selected voltage to the word line corresponding thereto and all of the other 511 driver circuits 1 output a non-selected voltage. Note that a negative voltage supply circuit 4 is a charge pump circuit for supplying a negative voltage Vbb to each of the applied voltage decoders 2 and the control voltage decoders 3.

In the arrangement shown in FIG. 1, since 8 applied voltage decoders 2 and 64 control voltage decoders 3 are provided, the total number of these circuits becomes 72. On the other hand, in the prior art arrangement shown in FIG. 23, the number of address decoders 7 is required to be the same as that of the driver circuits 1, i.e., 512. Therefore, in the present example, since the total number of circuits can be considerably reduced, it becomes possible to reduce the layout area occupied by the entire circuit.

It should be noted, as shown in FIG. 2, when the applied voltage decoder 2 is turned into the applied voltage selection state in the erasure mode, a negative selected voltage Vbb (e.g., −10 V) is applied to the source of the n-channel MOSFET 1b in the driver circuit 1. Therefore, if the same substrate voltage Vss (e.g., 0 V) as that applied in the writing mode and the reading mode is applied to the p-type semiconductor well on which this n-channel MOSFET 1b has been formed, then a leakage current flows from this p-type semiconductor well to the n-type semiconductor regions including the source and the drain. Thus, in this arrangement, the voltage output from the substrate voltage control circuit is applied to the p-type semiconductor well. During the writing mode and the reading mode, a substrate voltage Vss is applied to the well, while during the erasure mode, a negative substrate voltage Vbb (e.g.,−10 V) is applied to the well. It is noted that the substrate voltage applied in the erasure mode is not limited to the voltage Vbb so long as the substrate voltage is a negative voltage having an absolute value equal to or larger than that of the voltage Vbb. By applying a negative voltage to the p-type semiconductor well in this way, a forward bias is not caused even in the case of applying a selected voltage Vbb to the source of the n-channel MOSFET 1b so that it is possible to prevent a leakage current from being generated. As a result, a negative voltage can be applied to a word line using a CMOS inverter circuit.

Figure 3:
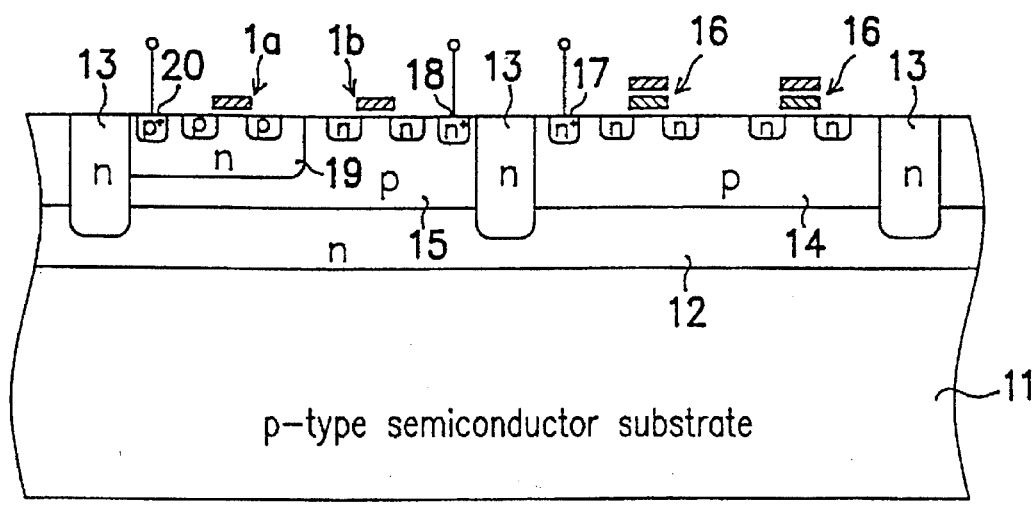
FIG. 3 is a vertical sectional view illustrating an example of the present invention and showing an element structure for a flash EEPROM.
Figure 4:
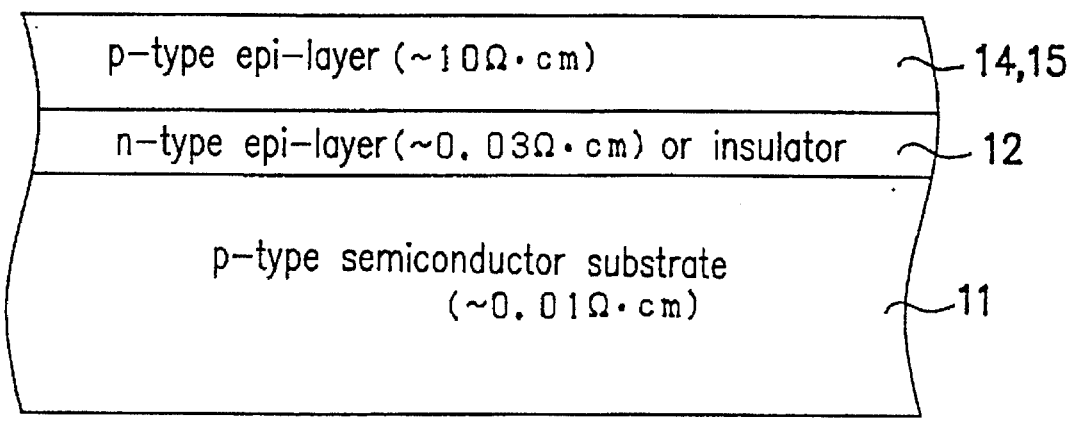
FIG. 4 is a vertical sectional view illustrating an example of the present invention and showing a relationship between a p-type semiconductor well and a p-type semiconductor substrate.

An element structure for a flash EEPROM for applying a negative voltage to the p-type semiconductor well forming the n-channel MOSFET 1b thereon is shown in FIG. 3. This flash EEPROM is formed on the p-type semiconductor substrate 11. An n-type semiconductor well 12 is formed over the p-type semiconductor substrate 11. Alternatively, an insulator layer may be formed instead of the n-type semiconductor well 12. Two p-type semiconductor wells 14 and 15 isolated by n-type semiconductor regions 13 are formed over the n-type semiconductor well 12. On one well of the p-type semiconductor wells, preferably well 14, a large number of cell transistors 16 and high-concentration n-type semiconductor regions 17 are formed, while preferably on the other p-type semiconductor well 15, an n-channel MOSFET 1b for the CMOS inverter circuit of each driver circuit 1 and high-concentration n-type semiconductor regions 18 are formed. An n-type semiconductor well 19 is also preferably formed in the p-type semiconductor well 15. On the n-type semiconductor well 19, a p-channel MOSFET 1a, for the CMOS inverter circuit of each driver circuit 1, and high-concentration p-type semiconductor region 20 are formed. Therefore, the p-type semiconductor well 15 with the n-channel MOSFET 1b formed thereon is formed over the p-type semiconductor substrate 11 via the n-type semiconductor well 12 or an insulator layer as shown in FIG. 4, so that the p-type semiconductor well 15 is electrically isolated from the p-type semiconductor substrate 11.

Figure 5:
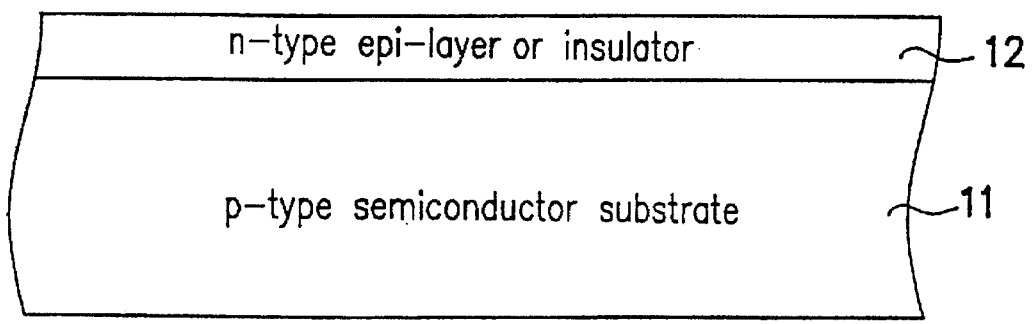
FIG. 5 is a vertical sectional view illustrating an example of the present invention and showing the first step of a semiconductor fabrication process for a flash EEPROM.
Figure 6:
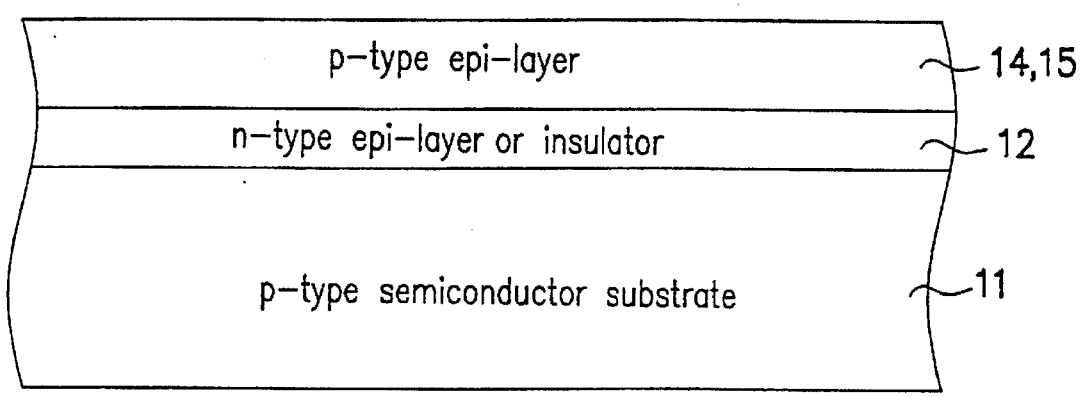
FIG. 6 is a vertical sectional view illustrating an example of the present invention and showing the second step of the semiconductor fabrication process for a flash EEPROM.

Next, a method for fabricating a flash EEPROM having such an element structure as heretofore described will be discussed. First, as shown in FIG. 5, an n-type semiconductor well 12 having a specific resistance of about 0.03 $\Omega \cdot cm$ is epitaxially grown to be about 2 μm thick on a p-type semiconductor substrate 11 having a specific resistance of about 0.01 $\Omega \cdot cm$ by employing a growth method such as a chemical vapor deposition method and a vacuum evaporation method. Note that, in the case of forming an insulator layer instead of the n-type semiconductor well 12, a single crystalline insulating layer made of $CeO_2$ or the like is epitaxially grown thereon to be about 2 μm thick in a similar manner. P-type semiconductor wells 14 and 15 having a specific resistance of about 0.5 $\Omega \cdot cm$ are epitaxially grown to be about 2 μm thick on the n-type semiconductor well 12 as shown in FIG. 6.

Figure 7:
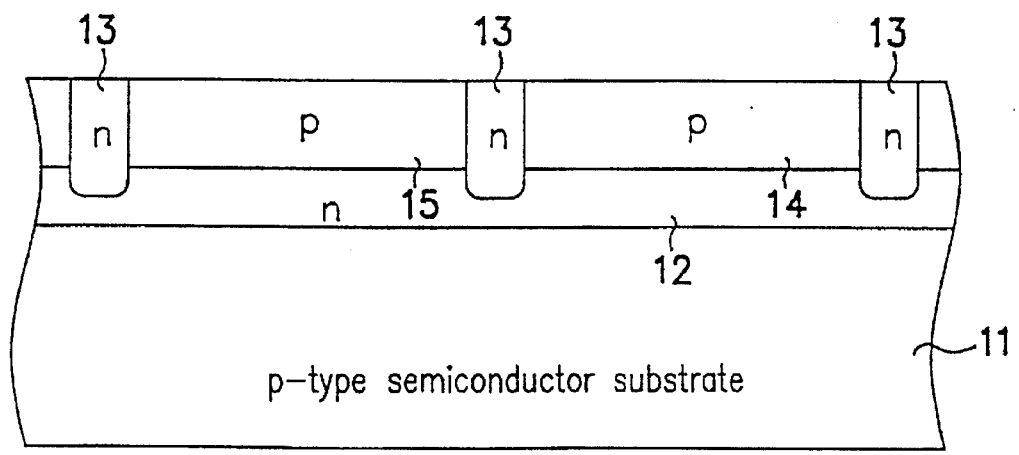
FIG. 7 is a vertical sectional view illustrating an example of the present invention and showing the third step of the semiconductor fabrication process for a flash EEPROM.

Next, as shown in FIG. 7, by forming n-type semiconductor regions 13 having a depth reaching the n-type semiconductor well 12 through the p-type semiconductor wells 14 and 15, the p-type semiconductor well 14 for forming the cell transistors thereon is electrically isolated from the p-type semiconductor well 15 for forming the CMOS inverter circuit of the driver circuit 1 thereon. These n-type semiconductor regions 13 can be formed by high-energy ion implantation technologies. By controlling the implantation energy, these regions can be formed so as to have a depth penetrating through the p-type semiconductor wells 14 and 15 to reach the n-type semiconductor well 12. The ion implantation is performed under the following conditions: P-type ions are used as ion seeds; the first implantation is performed at an acceleration energy of 5 MeV while setting the implant dose at $5 \times 10^{13}$ $cm^2$; the second implantation is performed at an acceleration energy of 3 MeV while setting the implant dose at $5 \times 10^{13}$ $cm^2$; the third implantation is performed at an acceleration energy of 1 MeV while setting the implant dose at $5 \times 10^{13}$ $cm^2$; and finally, the fourth implantation is performed at an acceleration energy of 100 keV while setting the implant dose at $3 \times 10^{13}$ $cm^2$. Then, by performing an annealing at 1000° C. for 60 minutes after this implantation has been performed, a doped region in which the P-type atomic concentration is about $10^{18}$ $cm^3$ can be formed. It is noted that insulator regions made of $SiO_2$ or the like may be formed instead of the n-type semiconductor regions 13. However, in the case of forming the n-type semiconductor well 12 on the p-type semiconductor substrate 11, not an insulator region but an n-type semiconductor region 13 is required to be formed between the p-type semiconductor wells 14 and 15, thereby applying a voltage equal to or higher than the voltage Vps to the p-type semiconductor well 14, as well as to the n-type semiconductor well 12 via the n-type semiconductor region 13 as will be described later. On the other hand, in the case of forming an insulator layer on the p-type semiconductor substrate 11, an insulator region can be formed instead of the n-type semiconductor region 13. Furthermore, in order to isolate a region other than the region between the p-type semiconductor wells 14 and 15, an insulator region can be formed instead of the n-type semiconductor region 13 in any of these cases.

Figure 8:
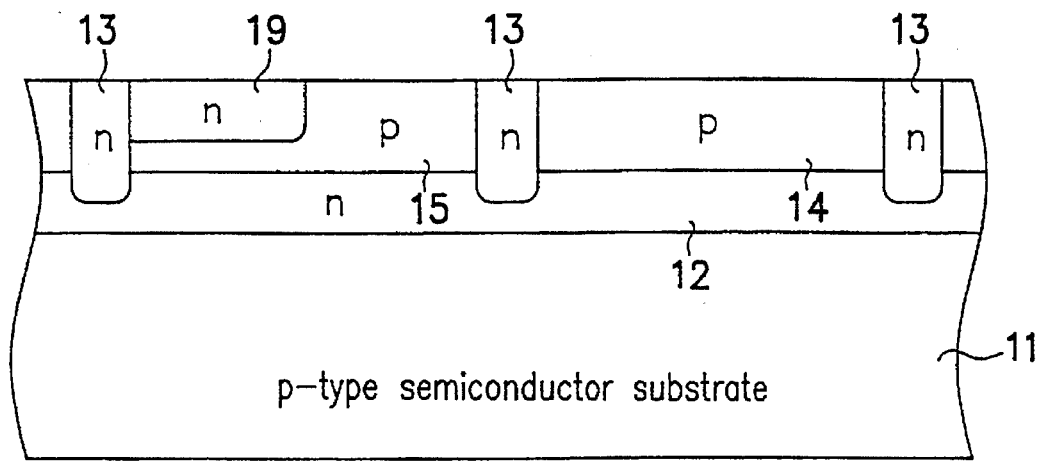
FIG. 8 is a vertical sectional view illustrating an example of the present invention and showing the fourth step of the semiconductor fabrication process for a flash EEPROM.
Figure 9:
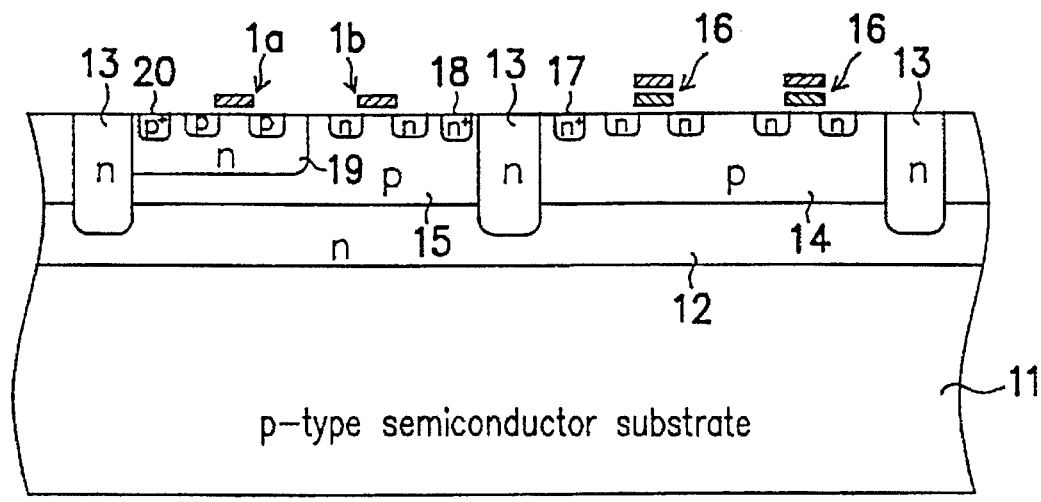
FIG. 9 is a vertical sectional view illustrating an example of the present invention and showing the final step of the semiconductor fabrication process for a flash EEPROM.

An n-type semiconductor well 19 is formed in a part of the p-type semiconductor well 15, as shown in FIG. 8. The flash EEPROM shown in FIG. 3 is then completed by forming cell transistors 16 and high-concentration n-type semiconductor regions 17 on the p-type semiconductor well 14, an n-channel MOSFET 1b and high-concentration n-type semiconductor regions 18 on the p-type semiconductor well 15, and a p-channel MOSFET 1a and high-concentration p-type semiconductor regions 20 on the p-type semiconductor well 15 as shown in FIG. 9.

The voltage output from the substrate voltage control circuit 5 is applied to the p-type semiconductor well 15, on which the n-channel MOSFET 1b has been formed, via the high-concentration n-type semiconductor regions 18 shown in FIG. 3. In addition, the substrate voltage control circuit 5 is supposed to apply a different voltage to the n-type semiconductor well 19, on which the p-channel MOSFET 1a has been formed, via the high-concentration p-type semiconductor regions 20 and apply a different voltage to the p-type semiconductor well 14 and the n-type semiconductor well 12 via the high-concentration n-type semiconductor regions 17. The voltages applied by the substrate voltage control circuit 5 to the p-type semiconductor well 15, the n-type semiconductor well 19, the p-type semiconductor well 14 and the n-type semiconductor well 12 in the respective operational modes are shown in the following Table 4.

TABLE 4

| mode | p-type semiconductor well 15 | n-type semiconductor well 19 | p-type semiconductor well 14 | n-type semiconductor well 12 |
| --- | --- | --- | --- | --- |
| writing | Vss (0 V) | Vpp (12 V) | Vss (0 V) | Vss (0 V) |
| reading | Vss (0 V) | Vcc (5 V) | Vss (0 V) | Vss (0 V) |
| erasure | Vbb (−10 V) | Vinh (3 V) | Vps (6 V) | Vps (6 V) |

As shown in Table 4, a voltage Vss (e.g., 0 V) is applied to the p-type semiconductor well 15, the p-type semiconductor well 14 and the n-type semiconductor well 12 in the writing mode and the reading mode. On the other hand, a voltage Vpp (e.g., 12 V) and a voltage Vcc (e.g., 5 V) are applied to the n-type semiconductor well 19 in the writing mode and in the reading mode, respectively.

In the erasure mode, a voltage Vbb (e.g., −10 V) is applied to the p-type semiconductor well 15 on which the n-channel MOSFET 1b is formed; a voltage Vinh (e.g., 3 V) is applied to the n-type semiconductor well 19 on which the p-channel MOSFET 1a is formed; and a voltage Vps (e.g., 6 V) is applied to the p-type semiconductor well 14 and the n-type semiconductor well 12. In this case, since a positive voltage Vinh is applied to the n-type semiconductor well 19 and a negative voltage Vbb is applied to the p-type semiconductor well 15, a backward bias is caused between the wells 19 and 15. However, since the p-type semiconductor wells 15 and 14 are electrically isolated from each other by the n-type semiconductor region 13, a different voltage can be separately applied to each of the wells 15 and 14. Furthermore, since a common voltage is always applied to the p-type semiconductor well 15 and the n-type semiconductor well 19 irrespective of the selection states, the MOSFETs 1a and 1b can be formed as an integral driver circuit 1 on the n-type semiconductor well 19 and the p-type semiconductor well 15, respectively, without being electrically isolated from each other.

As described above, since a voltage Vbb is applied to the p-type semiconductor well 15 in the erasure mode, even if a negative voltage Vbb is applied to the source and the drain of the n-channel MOSFET 1b, a forward bias is not caused and it is possible to prevent a leakage current from being generated. In addition, in this erasure mode, the same voltage Vps as the voltage applied to the source of the cell transistor 16 as shown in Table 1 is applied to the p-type semiconductor well 14, so that an inter-band current flowing between the source and the substrate can be reduced and it is possible to simultaneously erase the data, stored in a large-scale memory having a capacity exceeding 16 Mbits, for example, at a time. As a result, the time required for performing an erasure operation on a chip basis can be considerably reduced.

Figure 10:
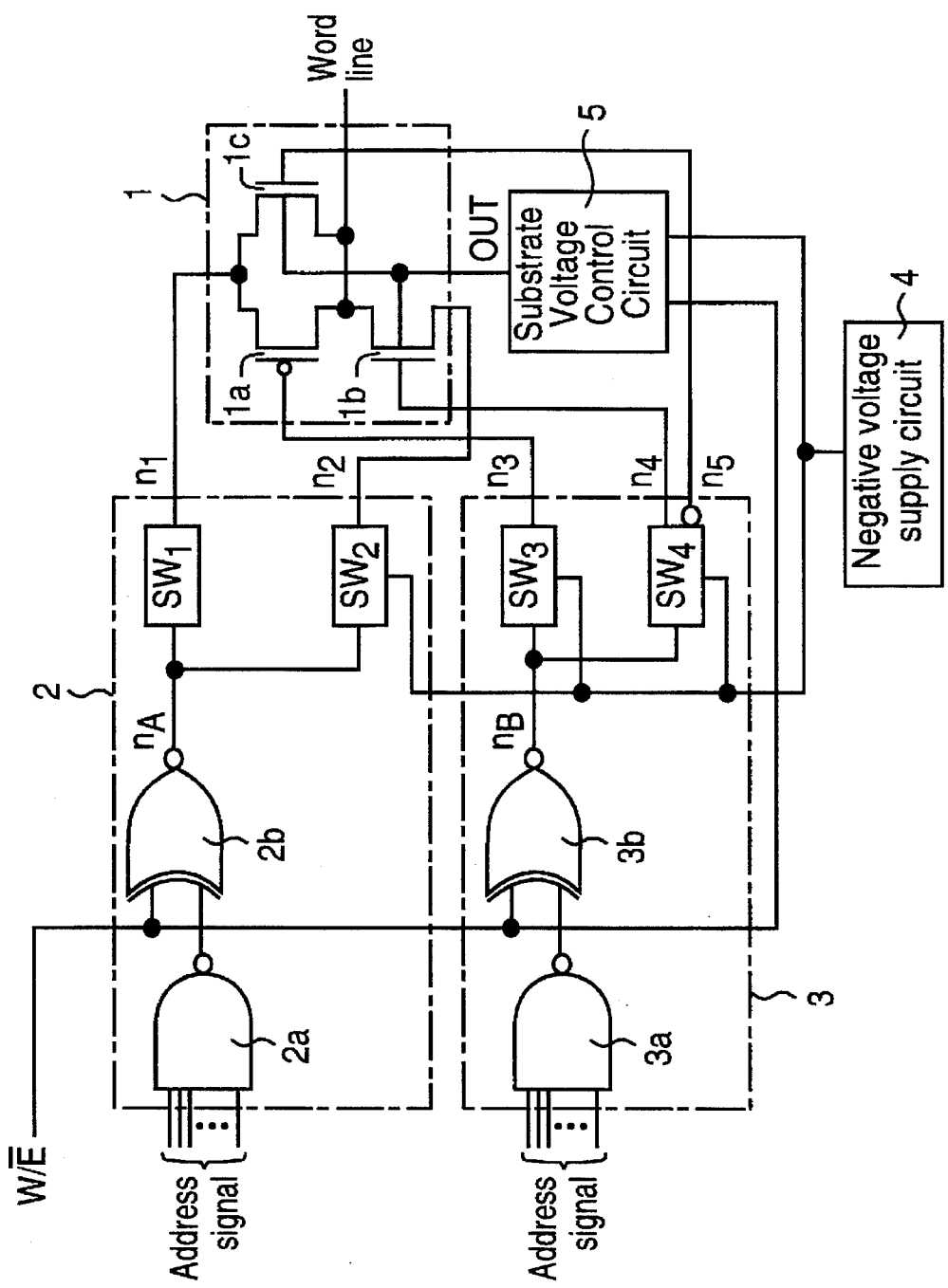
FIG. 10 is a circuit block diagram illustrating an example of the present invention and showing specific circuit configurations for a driver circuit, an applied voltage decoder and a control voltage decoder.

Specific configurations for one driver circuit 1 and a pair of an applied voltage decoder 2 and a control voltage decoder 3 which are connected to the driver circuit 1 are shown in FIG. 10. In this case, the driver circuit 1 includes not only a p-channel MOSFET 1a and an n-channel MOSFET 1b which form a CMOS inverter circuit but also a second n-channel MOSFET 1c connected in parallel to the p-channel MOSFET 1a. In addition, the output out of the substrate voltage control circuit 5 is supposed to be applied to the p-type semiconductor well 15 on which these n-channel MOSFETs 1b and 1c are formed as shown in FIG. 3.

The applied voltage decoder 2 includes: an NAND circuit 2a for decoding an address signal; an EX-NOR circuit 2b obtaining an exclusive-NOR of the output of the NAND circuit 2a and an erasure signal W/E-bar; and two switch circuits SW1 and SW2 to which the output nA of the EX-NOR circuit 2b is input. The NAND circuit 2a is a decoder which outputs an L level (a low voltage level) only when the address value of the address signal is within the address range specific to the applied voltage decoder 2. In the case where the L level is output, the applied voltage decoder 2 is turned into an applied voltage selection state. In FIG. 10, the address signal is assumed to be input to the NAND circuit 2a without performing any operation therefor. In actuality, decoding specific to each applied voltage decoder 2 is performed by inputting the address signal thereto after inverting different bits of the address signal among the respective applied voltage decoders 2 or omitting the lower bits of the address signal. Only when the erasure signal W/E-bar is at an L level representing the erasure mode does the EX-NOR circuit 2b invert and output the output of the NAND circuit 2a. Therefore, in the case where the applied voltage decoder 2 is in the applied voltage selection state, the output nA becomes the L level in the writing mode and the reading mode or an H level (a high voltage level) in the erasure mode.

Figure 11:
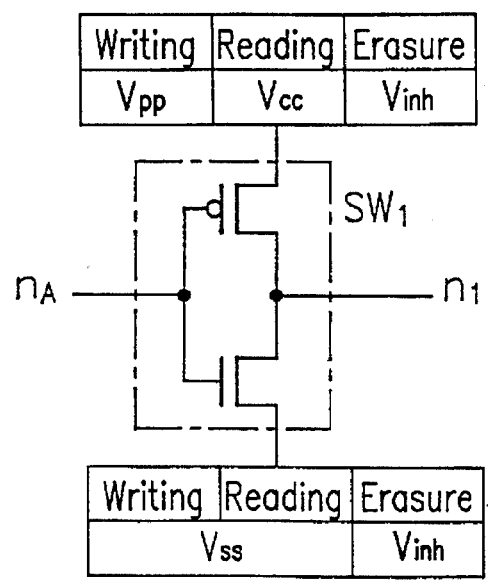
FIG. 11 is a circuit block diagram illustrating an example of the present invention and showing a specific circuit configuration for a switch circuit SW1.
Figure 12:
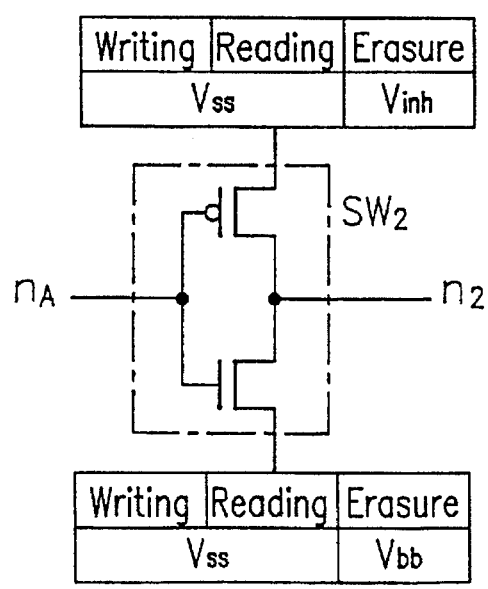
FIG. 12 is a circuit block diagram illustrating an example of the present invention and showing a specific circuit configuration for a switch circuit SW2.

The switch circuit SW1 is formed of a CMOS inverter circuit shown in FIG. 11. In the case where the output nA of the EX-NOR circuit 2b is at the L level, the switch circuit SW1 outputs selected voltages Vpp and Vcc and a non-selected voltage Vinh from an output n1 in the writing mode, the reading mode and the erasure mode, respectively. On the other hand, in the case where the output nA is at the H level, the switch circuit SW1 outputs a non-selected voltage Vss in the writing mode and the reading mode and output a non-selected voltage Vinh in the erasure mode. Moreover, the switch circuit SW2 is formed of a CMOS inverter circuit shown in FIG. 12. In the case where the output nA is at the L level, the switch circuit SW2 outputs a non-selected voltage Vss in the writing mode and the reading mode and a non-selected voltage Vinh in the erasure mode from an output n2. On the other hand, in the case where the output nA is at the H level, the switch circuit SW2 outputs a non-selected voltage Vss in the writing mode and the reading mode and output a non-selected voltage Vbb in the erasure mode.

The control voltage decoder 3 includes: a NAND circuit 3a which is similar to the NAND circuit 2a of the applied voltage decoder 2; an EX-NOR circuit 3b similar to the EX-NOR circuit 2b; and two switch circuits SW3 and SW4 to which the output nB of the EX-NOR circuit 3b is input.

Figure 13:
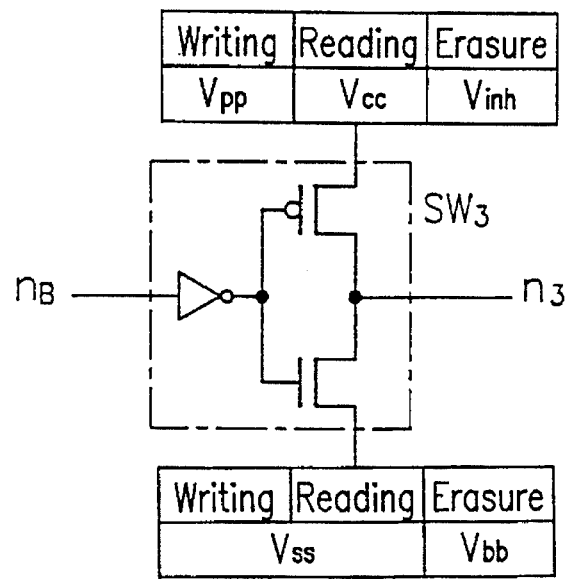
FIG. 13 is a circuit block diagram illustrating an example of the present invention and showing a specific circuit configuration for a switch circuit SW3.
Figure 14:
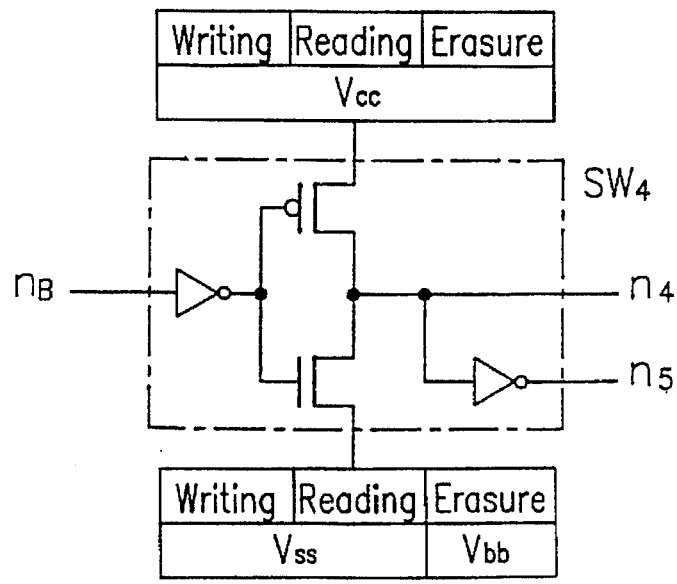
FIG. 14 is a circuit block diagram illustrating an example of the present invention and showing a specific circuit configuration for a switch circuit SW4.

The switch circuit SW3 is formed of a CMOS inverter circuit shown in FIG. 13. The output nB of the EX-NOR circuit 3b is assumed to be inverted and then input to the switch circuit SW3. In the case where the output nB is at the H level, the switch circuit SW3 outputs control voltages Vpp, Vcc and Vinh from an output n3 in the writing mode, the reading mode and the erasure mode, respectively. On the other hand, in the case where the output nB is at the L level, the switch circuit SW3 outputs a control voltage Vss in the writing mode and the reading mode and output a control voltage Vbb in the erasure mode. Moreover, the switch circuit SW4 is formed of a CMOS inverter circuit shown in FIG. 14. The output nB is assumed to be inverted and then input to the switch circuit SW4. In the case where the output nB is at the H level, the switch circuit SW4 always outputs a control voltage Vcc from an output n4. On the other hand, in the case where the output nB is at the L level, the switch circuit SW4 outputs a control voltage Vss in the writing mode and the reading mode and outputs a control voltage Vbb in the erasure mode. It is noted that an output n5 of the switch circuit SW4 is an inverted one of the output n4.

As shown in FIG. 10, the outputs n1 and n2 of the applied voltage decoder 2 are connected as power supplies for the driver circuit 1 to the source of the p-channel MOSFET 1a and the source of the n-channel MOSFET 1b, respectively. The outputs n3, n4 and n5 of the control voltage decoder 3 are connected to the gate of the p-channel MOSFET 1a of the driver circuit 1, the gate of the n-channel MOSFET 1b of the driver circuit 1 and the gate of the n-channel MOSFET 1c of the driver circuit 1, respectively.

Figure 15:
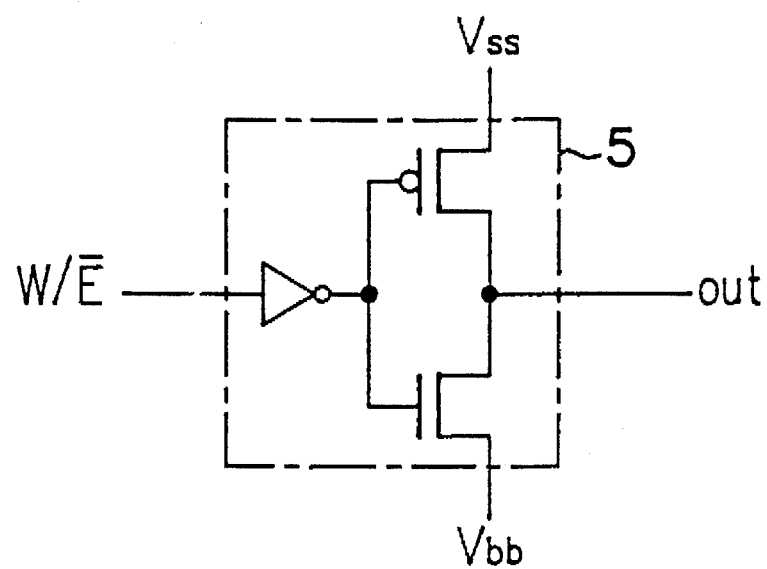
FIG. 15 is a circuit block diagram illustrating an example of the present invention and showing a specific circuit configuration for a substrate voltage control circuit.

The substrate voltage control circuit 5 is formed of a CMOS inverter circuit shown in FIG. 15. The erasure signal W/E-bar is assumed to be inverted and then input to the substrate voltage control circuit 5. In the case where the erasure signal W/E-bar is at the H level (in the writing mode and the reading mode), the substrate voltage control circuit 5 outputs a substrate voltage Vss from the output out. On the other hand, in the case where the erasure signal W/E-bar is at the L level (in the erasure mode), the substrate voltage control circuit 5 outputs a substrate voltage Vbb from the output out. Furthermore, a negative voltage Vbb is supplied from the negative voltage supply circuit 4 to the switch circuit SW2 of the applied voltage decoder 2, the switch circuits SW3 and SW4 of the control voltage decoder 3 and the substrate voltage control circuit 5.

The relationship among the outputs n1 and n2 of the applied voltage decoder 2, the outputs n3 to n5 of the control voltage decoder 3 and the voltage output from the driver circuit 1 to the word line in the above-described configuration is shown in the following Table 5.

Figure 16:
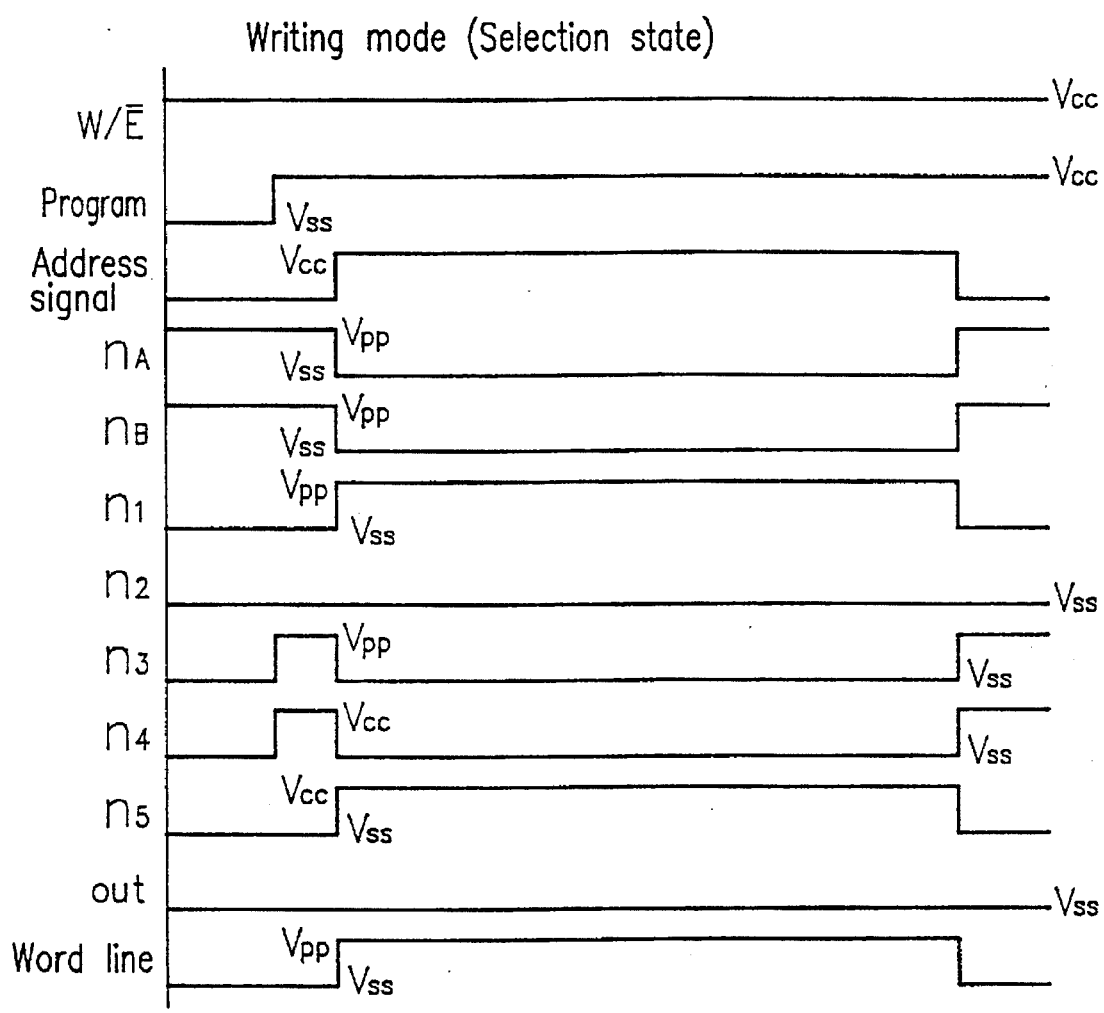
FIG. 16 is a timing chart illustrating an example of the present invention and showing the operation of a driver circuit connected to the word line which is selected in a writing mode.
Figure 17:
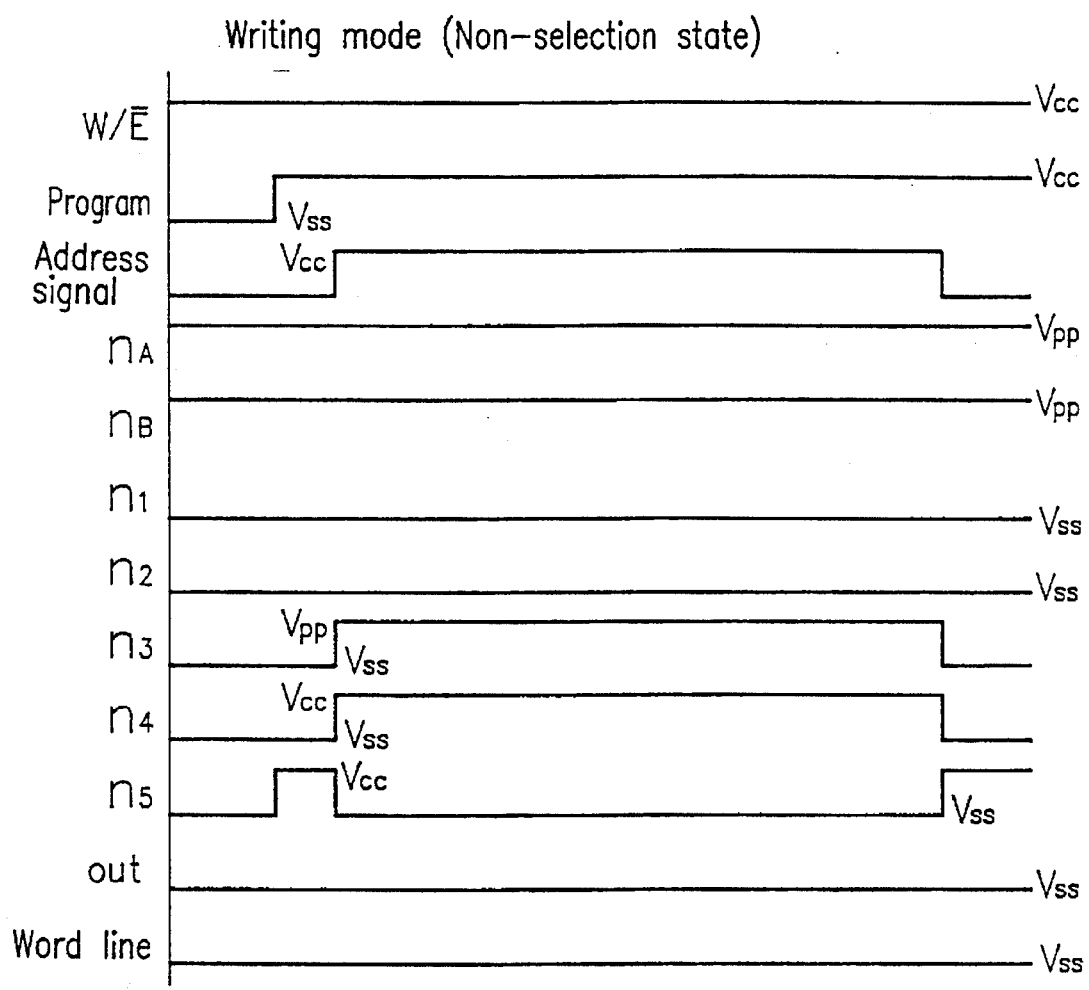
FIG. 17 is a timing chart illustrating an example of the present invention and showing the operation of a driver circuit connected to the word line which is non-selected in the writing mode.

In the writing mode, if both of the applied voltage decoder 2 and the control voltage decoder 3 are in the selection state, then the output n3 becomes equal to the control voltage Vss, so that the p-channel MOSFET 1a of the driver circuit 1 is turned ON and the selected voltage Vpp of the output n1 is output to the word line. More specifically, as shown in FIG. 16, when the level of the address signal is fixed after the program signal Program (not shown in FIG. 10) has risen to the H level and while the erasure signal W/E-bar remains at the H level, both of the outputs nA and nB of the NAND circuit 2a and 3a fall to the L level, the levels of outputs n1 to n5 are fixed and the selected voltage Vpp is output to the word line. On the other hand, in the case where the control voltage decoder 3 is in a control voltage non-selection state, the output n4 becomes equal to the control voltage Vcc, so that the n-channel MOSFET 1b of the driver circuit 1 is turned ON and the non-selected voltage Vss of the output n2 is output to the word line irrespective of the states of the applied voltage decoder 2. Furthermore, even in the case where the applied voltage decoder 2 is in an applied voltage non-selection state, both of the outputs n1 and n2 also become equal to the non-selected voltage Vss so that the non-selected voltage Vss is output to the word line irrespective of the states of the control voltage decoder 3. For example, if both of the applied voltage decoder 2 and the control voltage decoder 3 are in the non-selection state, then both of the outputs nA and nB become the H level and the output n4 becomes equal to the control voltage Vcc as shown in FIG. 17 so that the non-selected voltage Vss of the output n2 is output to the word line. It is noted that the output out of the substrate voltage control circuit 5 always becomes equal to the substrate voltage Vss in the writing mode. In the reading mode, the substrate voltage control circuit 5 is operated in a similar manner except that the selected voltage Vpp is replaced by the selected voltage Vcc.

Figure 18:
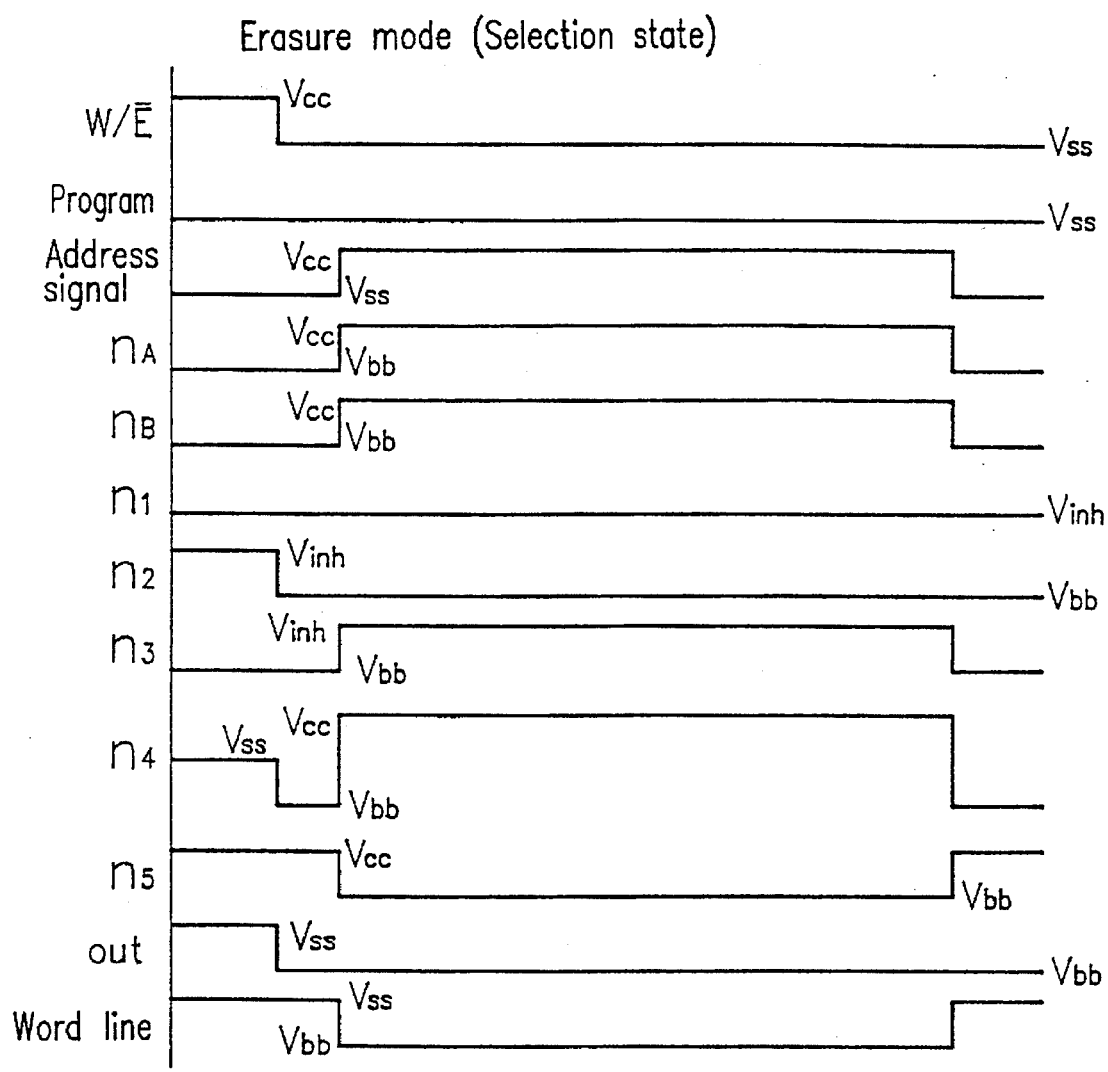
FIG. 18 is a timing chart illustrating an example of the present invention and showing the operation of a driver circuit connected to the word line which is selected in an erasure mode.

In the erasure mode, if both of the applied voltage decoder 2 and the control voltage decoder 3 are in the selection state, then the output n4 becomes equal to the control voltage Vcc so that the n-channel MOSFET 1b of the driver circuit 1 is turned ON and the selected voltage Vbb of the output n2 is output to the word line. More specifically, as shown in FIG. 18, when the level of the address signal is fixed after the erasure signal W/E-bar has fallen to the L level and while the program signal Program remains at the L level, both of the outputs nA and nB of the NAND circuit 2a and 3a are inverted by the EX-NOR circuits 2b and 3b, respectively, and rise to the H level. Also, the levels of outputs n1 to n5 are fixed and the selected voltage Vbb is output to the word line. On the other hand, in the case where the control voltage decoder 3 is in a control voltage non-selection state, the output n3 becomes equal to the control voltage Vbb so that the p-channel MOSFET 1a of the driver circuit 1 is turned ON and the non-selected voltage Vinh of the output n1 is always output to the word line irrespective of the states of the applied voltage decoder 2. Furthermore, even in the case

TABLE 5

Figure 19:
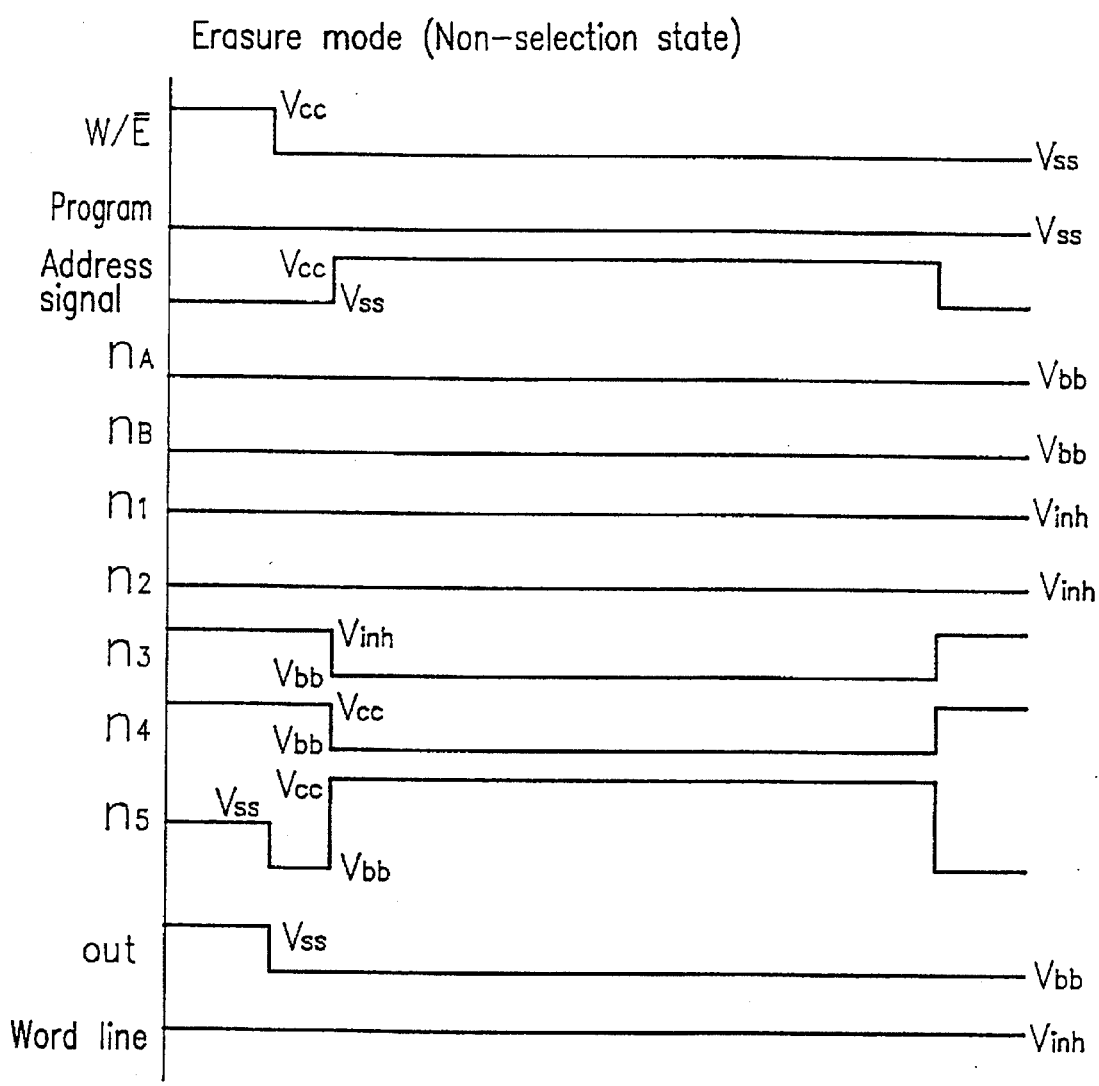
FIG. 19 is a timing chart illustrating an example of the present invention and showing the operation of a driver circuit connected to the word line which is non-selected in the erasure mode.
Figure 20:
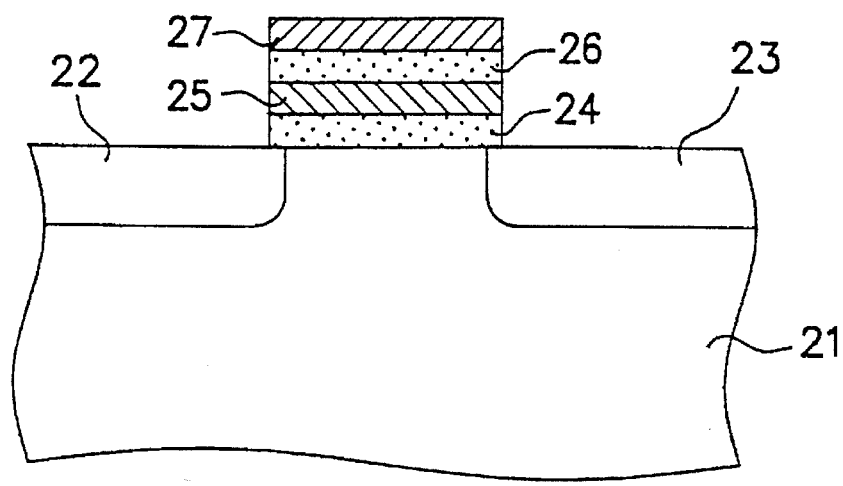
FIG. 20 is a vertical sectional view showing the structure of a cell transistor for a flash EEPROM.
Figure 21:
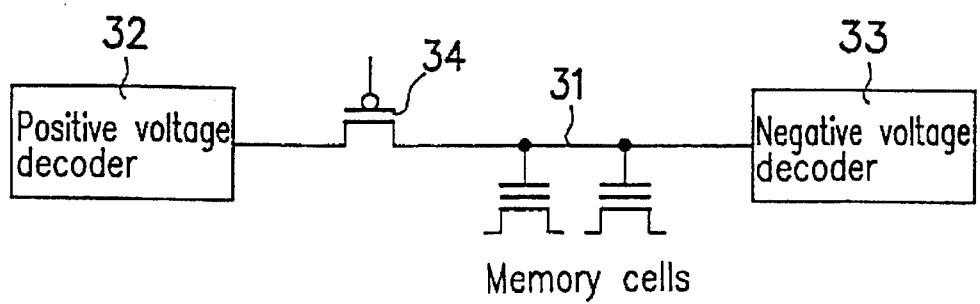
FIG. 21 is a circuit block diagram illustrating a conventional example and showing peripheral circuits for applying a positive voltage and a negative voltage to a word line.
Figure 22:
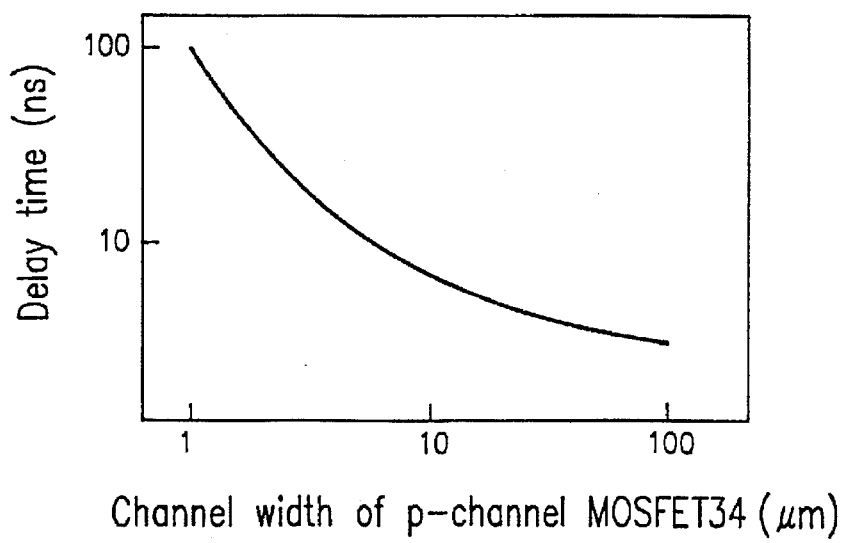
FIG. 22 is graph illustrating a conventional example and showing a relationship between the channel width and the delay time of a p-channel MOSFET for blocking a negative voltage.

| Output | Writing | | Reading | | Erasure | |
| --- | --- | --- | --- | --- | --- | --- |
| | Selection | Non-selection | Selection | Non-selection | Selection | Non-selection |
| n1 | Vpp | Vss | Vcc | Vss | Vinh | Vinh |
| n2 | Vss | Vss | Vss | Vss | Vbb | Vinh |
| n3 | Vss | Vpp | Vss | Vcc | Vinh | Vbb |
| n4 | Vss | Vcc | Vss | Vcc | Vcc | Vbb |
| n5 | Vcc | Vss | Vcc | Vss | Vbb | Vcc |
| Word line out | Vpp | Vss | Vcc | Vss | Vbb | Vinh | where the applied voltage decoder 2 is in an applied voltage non-selection state, both of the outputs n1 and n2 also become equal to the non-selected voltage Vinh, so that the non-selected voltage Vinh is always output to the word line irrespective of the states of the control voltage decoder 3. For example, if both of the applied voltage decoder 2 and the control voltage decoder 3 are in the non-selection state, then both of the outputs nA and nB become the L level and the output n3 becomes equal to the control voltage Vbb as shown in FIG. 19 so that the non-selected voltage Vinh of the output n1 is output to the word line. It is noted that the output out of the substrate voltage control circuit 5 always becomes equal to the substrate voltage Vbb in the erasure mode.

As described above, in the flash EEPROM of the present arrangement, appropriate voltages can be respectively applied to the 512 word lines by the 8 applied voltage decoders 2 and the 64 control voltage decoders 3 via the 512 driver circuits 1, thereby considerably reducing the total number of peripheral circuits for driving these word lines.

Figure 23:
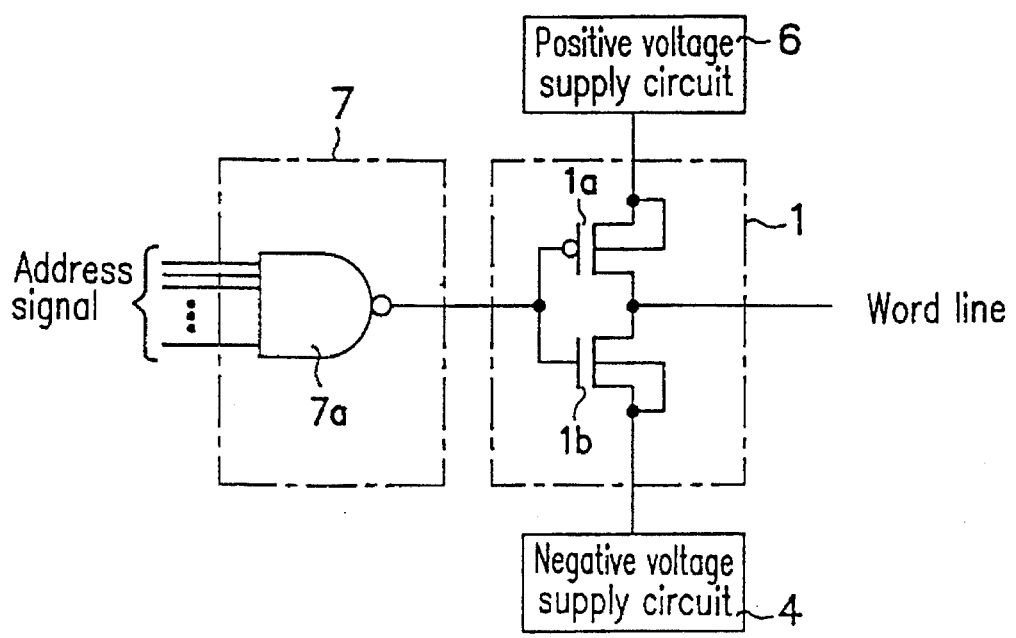
FIG. 23 is a block diagram illustrating a conventional example and showing peripheral circuits for driving one word line.

In the conventional example shown in FIG. 23, the number of transistors required for one address decoder 7 is 16 and the number of transistors required for one driver circuit 1 is 2, so that the total number of transistors required for all the address decoders 7 and the driver circuits 1 becomes about 9300. On the other hand, in this example, as shown in FIG. 10, the number of transistors required for one applied voltage decoder 2 is 12, the number of transistors required for one control voltage decoder 3 is 17 and the number of transistors required for one driver circuit 1 is 3, so that the total number of transistors required for all the applied voltage decoders 2, the control voltage decoders 3 and the driver circuits 1 becomes about 2600. Therefore, assuming that a transistor of the same size is used in both cases, according to the present invention, the layout area occupied by the entire circuit can be reduced to about 30% of that in the conventional example.

Figure 24:
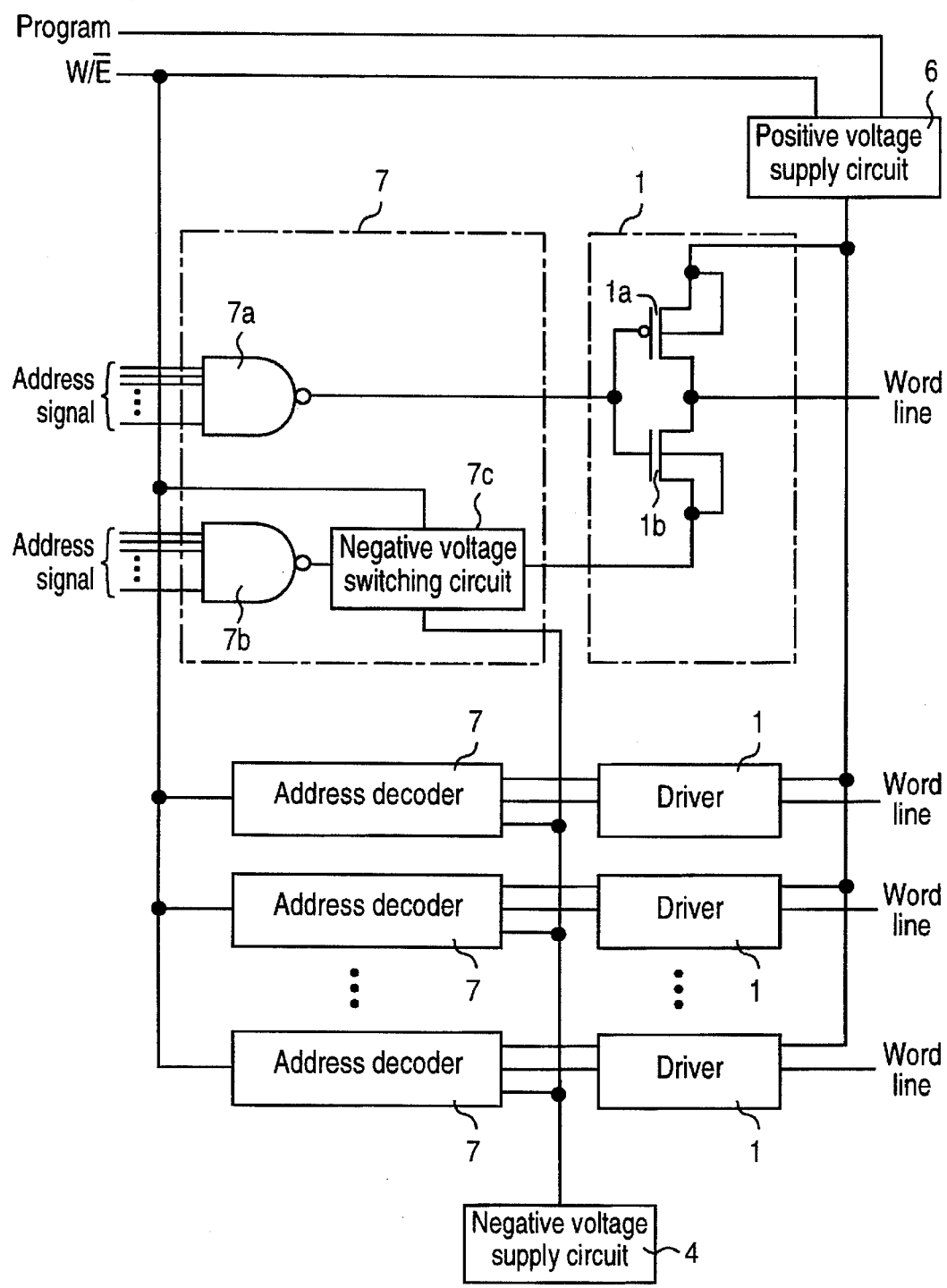
FIG. 24 is a block diagram illustrating a conventional example and showing peripheral circuits for driving multiple word lines.

Furthermore, in the case of performing a sector erasure operation on the word line basis as in the conventional example shown in FIG. 24, the source of the n-channel MOSFET 1b is connected to the p-type semiconductor well 15 shown in FIG. 3 in each driver circuit 1. Therefore, it has conventionally been necessary to form the respective n-channel MOSFETs 1b while electrically isolating the MOSFETs 1b from each other. However, in the driver circuits 1 according to the present invention, because a common substrate voltage is applied to the p-type semiconductor well 15 for the n-channel MOSFETs 1b, all the driver circuits 1 can be formed on a common p-type semiconductor well 15. Therefore, assuming that a transistor of the same size is used in both cases, since the regions for isolating the p-type semiconductor wells 15 corresponding to the respective driver circuits 1 are no longer necessary according to the present invention, the layout area occupied by the entire circuit can be reduced to about 50% of that of the conventional example.

As is apparent from the foregoing description, in the nonvolatile semiconductor storage device according to the present invention, by dividing the functions of an address decoder into the function performed by an applied voltage decoder and the function performed by a control voltage decoder, the layout area occupied by the peripheral circuits for driving the word lines can be reduced. In addition, since selected voltages and non-selected voltages corresponding to the respective operational modes can be applied to the word lines by a common CMOS inverter circuit even in a negative voltage erasure method, it is no longer necessary to isolate the decoders for applying positive voltages and the decoders for applying negative voltages, and whereby the layout area occupied by the peripheral circuits can also be reduced. Furthermore, since selected voltages and non-selected voltages can be applied to the respective word lines without isolating the regions where the CMOS inverter circuits for the respective driver circuits are formed from each other, the sector erasure operation or the like can be performed on the word line basis even in the case where a common CMOS inverter circuit is used for applying a positive voltage and a negative voltage.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nonvolatile semiconductor storage device for applying to each of a plurality of word lines either one of a selected voltage and a non-selected voltage, corresponding to a selection state and a non-selection state, respectively, the selection state or the non-selection state being selected in accordance with an address signal in each operational mode, comprising:

a plurality of applied voltage decoders operating in accordance with an applied voltage selection state or an applied voltage non-selection state which is selected in accordance with the address signal in each operational mode, each of the applied voltage decoders outputting a first applied voltage to be a selected voltage and a second applied voltage to be a non-selected voltage in the applied voltage selection state and outputting a first applied voltage and a second applied voltage both of which are to be non-selected voltages in the applied voltage non-selection state;

a plurality of control voltage decoders, each of the control voltage decoders outputting a control voltage corresponding to either a control voltage selection state or a control voltage non-selection state which is selected in accordance with the address signal in each operational mode; and a plurality of driver circuits, each of the driver circuits being provided so as to correspond to one of the plurality of word lines; each of the driver circuits receiving a first applied voltage, a second applied voltage and a control voltage which are output from a corresponding distinct combination of an applied voltage decoder and a control voltage decoder; each of the driver circuits outputting the first applied voltage to the word line corresponding to the decoder circuit when the control voltage in the control voltage selection state is input to the decoder circuit; and each of the driver circuits outputting the second applied voltage to the word line corresponding to the decoder circuit when the control voltage in the control voltage non-selection state is input to the decoder circuit.

2. A nonvolatile semiconductor storage device according to claim 1, wherein the selected voltage applied to a word line in the selection state is a negative voltage in an erasure mode.

3. A nonvolatile semiconductor storage device according to claim 2, wherein each of the plurality of driver circuits is formed of a CMOS inverter circuit in which a first applied voltage and a second applied voltage output from the applied voltage decoder corresponding to the driver circuit are used as power supplies; a control voltage output from the control voltage decoder corresponding to the driver circuit is used as an input; and an output of the inverter circuit is connected to a word line corresponding to the driver circuit.

4. A nonvolatile semiconductor storage device according to claim 3, wherein an n-channel MOSFET of the CMOS inverter circuit is formed on a p-type semiconductor well which is formed in a p-type semiconductor substrate via an n-type semiconductor well or an insulator layer; a p-channel MOSFET of the CMOS inverter circuit is formed on an n-type semiconductor well which is formed in the p-type semiconductor well; and a substrate voltage control circuit for applying a negative voltage having an absolute value equal to or larger than that of the negative selected voltage to the p-type semiconductor well in the erasure mode is provided.

* * * * *